United States Patent [19]

Gillery

[11] Patent Number: 4,466,875

[45] Date of Patent: Aug. 21, 1984

[54] AUXILIARY HEATER FOR MAGNETRON SPUTTERING

[75] Inventor: F. Howard Gillery, Allison Park, Pa.

[73] Assignee: PPG Industries, Inc., Pittsburgh, Pa.

[21] Appl. No.: 556,656

[22] Filed: Nov. 30, 1983

[51] Int. Cl.³ .............................................. C23C 15/00
[52] U.S. Cl. ................................. 204/192 R; 204/298
[58] Field of Search ........................... 204/192 R, 298

[56] References Cited

U.S. PATENT DOCUMENTS

| | | | |
|---|---|---|---|
| 3,749,662 | 7/1973 | Biehl | 204/192 R |
| 3,907,660 | 9/1975 | Gillery | 204/298 |
| 4,166,018 | 8/1979 | Chapin | 204/192 |
| 4,324,631 | 4/1982 | Meckel et al. | 204/192 M |

*Primary Examiner*—Arthur P. Demers
*Attorney, Agent, or Firm*—Donna L. Seidel

[57] ABSTRACT

An improved heating means is disclosed for substrates to be coated by cathode sputtering, comprising a radiant heating means used in scanning mode prior to cathode sputtering to heat directly the surface to be coated.

13 Claims, No Drawings

AUXILIARY HEATER FOR MAGNETRON SPUTTERING

BACKGROUND OF THE INVENTION

This invention relates generally to the art of magnetron sputtering and more particularly to the art of magnetron sputtering of coatings onto heated substrates.

U.S. Pat. No. 3,907,660 to Gillery discloses cathode sputtering of a film onto a substrate at a controlled substrate temperature within a temperature range of 400° F. to a temperature at which the substrate becomes distorted or detrimentally affected, usually at or above 600° F. Heating of the substrate is accomplished by means of exposed electroconductive heating wires, coupled electrically to a low voltage source, equally spaced from one another and disposed below the substrate in an area aligned with and extending beyond the area occupied by the substrate to ensure uniform heating. This arrangement using radiant heat is disclosed to be superior to prior art heating by conduction.

U.S. Pat. No. 4,166,018 to Chapin discloses a sputtering apparatus in which a magnetic field is formed adjacent a planar sputtering surface, the field comprising arching lines of flux over a closed loop erosion region on the sputtering surface.

SUMMARY OF THE INVENTION

The present invention provides means for directly heating the substrate surface to be coated when a scanning cathode is used. The present invention involves installing radiant heating means onto the cathode scanning apparatus.

DETAILED DESCRIPTION OF THE PREFERRED EMBODIMENT

Cathode sputtering of metal-containing films onto nonmetallic substrates generally requires substrate temperatures of at least about 400° F. (about 204° C.). U.S. Ser. No. 556,657 filed by F. H. Gillery on even date herewith discloses that magnetron sputtering, known to be carried out at ambient temperature, may be improved by coating substrates at elevated temperatures.

In known cathode sputtering techniques, substrates to be coated on the top surface by an overhead cathode are heated from below, whether by conduction from a heated support or by radiant heating as taught in U.S. Pat. No. 3,907,660 to Gillery. However, with poorly conducting substrates such as plastics, the top surface temperature is substantially lower than the bottom surface temperature, the difference varying with the thickness and composition of the plastic, and it may not be possible to achieve the desired top surface temperature without detrimentally overheating the bottom surface. In cathode sputtering processes wherein large substrates are coated with scanning cathodes, it is not practicable to install sufficiently large radiant heaters in the top of the vacuum chamber to maintain the entire substrate at the desired temperature because such radiant heating means would interfere with the operation of the scanning cathode.

In accordance with the present invention, these problems are solved by installing a radiant heater onto the scanning apparatus, preferably alongside the cathode. The apparatus is employed in the scanning mode with the heating means activated for as many passes as necessary to elevate the temperature of the substrate surface to be coated to the desired temperature prior to activating the cathode for sputtering. The heating means may be inactivated or remain activated during the sputtering process.

The scanning heater means of the present invention enables the surface to be coated to be heated to the desired temperature without detrimentally overheating the opposite surface. Although the scanning heater means of the present invention is particularly suitable for heating poorly conducting substrates, it is equally applicable to substrates which are good heat conductors. The scanning heater means of the present invention may save both time and equipment costs in any cathode sputtering process, and is particularly useful in magnetron sputtering processes, which do not inherently produce appreciable heat.

The present invention will be further understood from the description of a specific example which follows.

EXAMPLE I

An acrylic substrate ¼ inch thick (about 6 millimeters) heated from below when the top surface is to be coated typically develops a temperature gradient of at least about 50° F. (about 30° C.). For example, when the bottom surface reaches 200° F. (about 93° C.), a desirable coating temperature, the top surface is only at 150° F. (about 65° C.). Before the top surface, which is the surface to be coated, reaches the desired temperature for deposition of a coating by cathode sputtering, the bottom surface may become detrimentally overheated. In this example, a quartz heater is attached to the scanning apparatus. Operating at 560 watts while scanning at 120 inches (about 3 meters) per minute, the heater raises the top surface temperature of the acrylic substrate to 195° F. (about 91° C.). With the bottom heater turned off, the acrylic substrate top surface temperature is about 180° F. (about 82° C.) while the bottom surface temperature is about 155° F. (about 68° C.). After the top surface is heated to about 195° F. (about 91° C.), the top heater is turned off and the cathode sputtering deposition is initiated. Process heat is sufficient to maintain the top surface temperature at 195° to 200° F. (about 91° to 93° C.) during the deposition of the coating.

The above example is offered to illustrate the present invention. Various modifications such as heater design, location and power, temperatures, scanning parameters, substrate and coating compositions, and so on are included within the scope of the present invention which is defined by the following claims.

I claim:

1. In a method for coating a large substrate by sputtering a scanning cathode wherein the substrate is heated, the improvement which comprises employing radiant heating means in scanning mode to heat the top surface to be coated prior to cathode sputtering.

2. The improved method according to claim 1, wherein the radiant heating means is attached to the scanning mechanism to which the cathode is attached.

3. The improved method according to claim 1, wherein the substrate is selected from the group consisting of glass and plastics.

4. The improved method according to claim 3, wherein the substrate is acrylic.

5. The improved method according to claim 1, wherein the radiant heating means is a quartz heater.

6. The improved method according to claim 1, wherein the radiant heater means to heat the top surface is employed in combination with means to heat the bottom surface.

7. The improved method according to claim 1, wherein the radiant heating means is inactivated when cathode sputtering commences.

8. The improved method according to claim 1, wherein the top surface is heated to at least 180° F. (about 82° C.).

9. The improved method according to claim 8, wherein the top surface is heated to at least 195° F. (about 91° C.).

10. The improved method according to claim 8, wherein the heat from the cathode sputtering process maintains the top surface temperature in the range of 195° to 230° F. (about 91° to 110° C.).

11. The improved method according to claim 10, wherein the top surface temperature is maintained in the range of 200° to 210° F. (about 93° to 99° C.).

12. The improved method according to claim 1, wherein the cathode comprises a metal selected from the group consisting of indium, tin and mixtures thereof.

13. The improved method according to claim 12, wherein the cathode comprises an alloy of 90 percent indium and 10 percent tin.

* * * * *